(12) United States Patent
Watanabe et al.

(10) Patent No.: US 7,411,327 B2
(45) Date of Patent: Aug. 12, 2008

(54) HEAT-EMITTING ELEMENT COOLING APPARATUS

(75) Inventors: Michinori Watanabe, Nagano (JP);
Toshiki Ogawara, Nagano (JP);
Haruhisa Maruyama, Nagano (JP)

(73) Assignee: Sanyo Denki Co., Ltd., Tokyo (JP)

( * ) Notice: Subject to any disclaimer, the term of this patent is extended or adjusted under 35 U.S.C. 154(b) by 297 days.

(21) Appl. No.: 11/127,736

(22) Filed: May 12, 2005

(65) Prior Publication Data

US 2005/0253467 A1 Nov. 17, 2005

(30) Foreign Application Priority Data

May 13, 2004 (JP) ............................. 2004-143706

(51) Int. Cl.
*H02K 7/00* (2006.01)
(52) U.S. Cl. ...................................... 310/71; 417/423.7
(58) Field of Classification Search ................... 310/71, 310/89; 417/423.7, 423.14
See application file for complete search history.

(56) References Cited

U.S. PATENT DOCUMENTS

| | | | | |
|---|---|---|---|---|
| 3,644,066 A | * | 2/1972 | Heob et al. .................. 417/354 |
| 3,700,358 A | * | 10/1972 | Papst et al. .................. 417/354 |
| 4,636,669 A | * | 1/1987 | Plunkett et al. ................ 310/51 |
| 6,174,145 B1 | * | 1/2001 | Taniguchi ............... 417/423.14 |
| 6,407,913 B1 | | 6/2002 | Peachey et al. |
| 6,480,383 B2 | | 11/2002 | Kodaira et al. |
| 6,621,699 B2 | | 9/2003 | Watanabe et al. |
| 6,671,172 B2 | | 12/2003 | Carter et al. |
| 6,942,471 B2 | * | 9/2005 | Weisser .................... 417/423.1 |
| 7,066,720 B2 | * | 6/2006 | Cheng et al. ............. 417/423.3 |
| 7,221,567 B2 | * | 5/2007 | Otsuki et al. ................. 361/695 |
| 2002/0075649 A1 | | 6/2002 | Chou | |

FOREIGN PATENT DOCUMENTS

JP 2002-280780 9/2002

\* cited by examiner

*Primary Examiner*—Dang D Le
(74) *Attorney, Agent, or Firm*—Rankin, Hill & Clark LLP

(57) ABSTRACT

There is provided a fan unit in which when the fan unit is conveyed, existence of a plurality of lead wires will not become an obstacle to the conveyance.

Four lead wire engaging sections 27, 29, 31, and 33 are provided along the contour of an outer wall section 25 of a fan casing 15 as the fan casing 15 is viewed from a predetermined position in a forward direction. Then, the lead wire engaging sections 27, 29, 31 and 33 are configured to engage a part of lead wires 24 so as to prevent the lead wires 24 from coming out of the fan casing 15 one or more during the conveyance.

8 Claims, 7 Drawing Sheets

HEAT-EMITTING ELEMENT COOLING APPARATUS

BACKGROUND OF THE INVENTION

The present invention relates to a fan unit and a heat-emitting element cooling apparatus which uses the fan unit, for cooling a heat emitting element such as an electronic component.

Such a heat-emitting element cooling apparatus has been known that includes a heat sink having a base and a plurality of radiation fins, and a fan unit. In this apparatus, a heat-emitting element to be cooled is mounted on the rear surface of the base, and the radiation fins are fixed to the base. The fan unit is disposed over the heat sink, for blowing air along one or more the radiation fins to promote heat dissipation from the radiation fins. In this heat-emitting element cooling apparatus, heat generated from the heat-emitting element is transferred from the base to the radiation fins. Then, the air flowing from the fan unit along the radiation fins carries away the heat of the radiation fins, thereby cooling the heat-emitting element.

U.S. Pat. No. 6,407,913 and U.S. Pat. No. 6,621,699, for example, disclose electronic component cooling apparatuses in each of which a heat sink provided with a plurality of radiation fins juxtaposed on a base, is cooled by a fan unit. In these units, the fan unit is mounted on the heat sink through mounting engaging structures. Further, a plurality of lead wires are arranged along one of webs coupling motor supporting means for supporting a motor to a fan casing.

U.S. Pat. No. 6,671,172 discloses an electronic component cooling apparatus including a plurality of radiation fins that extend radially in the radial direction of a base with respect to the base that extends in the axial direction of a revolving shaft of a fan unit. Air flow passages formed between two adjacent radiation fins of the radiation fins are open toward both of the axial directions and toward the radially outward direction. This publication also discloses a structure in which each of four engaging sections that extend from the fan casing of the fan unit is inserted into each of the air flow passages formed between the two adjacent radiation fins of a heat sink, thereby preventing the fan casing from rotating with respect to the heat sink. Still further, the radiation fins disclosed in this publication are curved in one of the peripheral directions of the revolving shaft, and air supplied from the fan unit rotates in a direction opposite to the direction in which the radiation fins are curved.

FIG. 3 of U.S. Pat. No. 6,480,383 discloses a technique by which a plurality of projections provided for a fan casing is inserted into air flow passages each formed between two adjacent radiation fins of a plurality of radiation fins, thereby preventing the fan casing from being disengaged from the heat sink.

USPAP No. 2002/0075649 discloses a structure in which a plurality of mounting engaged sections is provided in a plurality of radiation fins, and a plurality of mounting engaging sections provided on a fan casing of a fan unit engages the mounting engaged sections, thereby mounting the fan unit on a heat sink. The mounting engaged sections disclosed in this publication are respectively constituted by notches formed at ends of a part of the radiation fins in their radially outward direction. Hooks for engaging the notches are integrally provided on the mounting engaging sections on the fan casing.

Further, Japanese Patent Application Laid-Open Publication No. 280780/2002 discloses an integrated circuit cooling unit in which in order to mount a fan unit on a heat sink, grooves for partially receiving a plurality of lead wires that extend from the fan unit are formed in a fan holder attached to a heat sink, thereby preventing the lead wires from coming out of the fan holder.

In the cooling unit disclosed in Japanese Patent Application Laid-Open Publication No. 280780/2002, the lead wires are fitted into the grooves arranged in the fan holder for mounting the fan unit on the heat sink. For this reason, when the fan unit is conveyed discretely, the lead wires need to be bent a plurality of times and bound together by a string, a rubber band, or the like. In the configuration disclosed in this publication, the lead wires are bent so that they meander along the side wall of the fan holder. The work of bending the lead wires so that they meander the side wall of the fan holder is difficult, so that the work becomes time-consuming unless it is accustomed to be done. Further, if the lead wires are bent at short intervals, an undue force will be applied to the lead wires or great deformation will be caused in the lead wires. Then, a lead wire disconnection may be generated. Further, when the length of the lead wires in this configuration becomes too long, the lead wires cannot be held by the fan holder without becoming an obstacle.

SUMMARY OF THE INVENTION

An object of the present invention is therefore to provide a fan unit and a heat-emitting element cooling apparatus in which when the fan unit and the heat-emitting element cooling apparatus are conveyed, a plurality of lead wires will not become an obstacle to the conveyance.

Another object of the present invention is to provide a fan unit and a heat-emitting element cooling apparatus in which a plurality of lead wires can be attached to a fan casing so as not to be come out of the fan casing without an undue force applied or great deformation caused in the lead wires.

Other object of the present invention is to provide a fan unit and a heat-emitting element cooling apparatus in which, when a plurality of lead wires are wound along the contour of the outer wall section of a fan casing, the lead wires can be attached to the fan casing just by inserting the lead wires into lead-wire-inserting openings of a plurality of lead wire engaging sections.

Still other object of the present invention is to provide a fan unit and a heat-emitting element cooling apparatus in which when a plurality of lead wires is wound along the contour of the outer wall section of a fan casing, an undue force will not be applied to connecting portions between the lead wires and terminals on the side of a motor.

Another object of the present invention is to provide a fan unit and a heat-emitting element cooling apparatus in which a lead wire supporting section is provided between adjacent two of lead wire engaging sections additionally provided, thereby preventing movement of a plurality of lead wires and making it difficult for the lead wires to come off from the lead wire engaging sections.

Other object of the present invention is to provide a heat-emitting element cooling apparatus having a simplified structure in which without additionally providing a lead wire supporting section, an existent mounting engaging section is also used as the lead wire supporting section.

Still other object of the present invention is to provide a fan unit and a heat-emitting element cooling apparatus in which end portions of a plurality of lead wires wound along the outer wall section of a fan casing are located in a more forward direction than a fan unit, thereby preventing the end portions of the lead wires from becoming an obstacle to the work of packing.

Another object of the present invention is to provide a heat-emitting element cooling apparatus in which a fan unit can be firmly attached to a heat sink without rattling.

A fan unit according to the present invention includes a motor having a revolving shaft; a motor supporting member; an impeller; and a fan casing. In this specification, one of two axial directions in which the revolving shaft of the motor extends is defined as the forward direction and the other of the two axial directions is defined as a backward direction. The motor supporting member is located in a more forward direction than the revolving shaft of the motor, for supporting the motor. The impeller has a plurality of blades and is mounted on the revolving shaft, for rotation. The impeller is located in the more backward direction than the motor supporting member. Then, the impeller is rotatably received in the fan casing. Generally, the motor supporting member is coupled to the fan casing by a plurality of webs arranged at intervals in a peripheral direction of the revolving shaft. Then, a plurality of lead wires connected to the motor extends outside the motor supporting member. Normally, the ends of the lead wires are arranged within the motor supporting member or soldered to a plurality of electric terminals of a motor driving circuit mounted on the motor. The respective lead wires may be kept away from one another, but may have a wire harness structure in which the respective lead wires are mutually combined. To the other electric terminals of the lead wires, a connector may be connected.

In the present invention, a plurality of lead wire engaging sections are provided at the outer wall of the fan casing. The lead wire engaging sections are arranged at predetermined intervals along a contour of the outer wall when the fan casing is viewed from a predetermined position located in the forward direction. These lead wire engaging sections are so configured to engage a part of lead wires respectively and are used so as to prevent the lead wires from coming out of the fan casing one or more during conveyance. According to the present invention, just by performing work of engaging the lead wires with the lead wire engaging sections arranged along the contour of the outer wall section of the fan casing, the lead wires can be attached to the fan casing without applying an undue force to or causing great deformation in the lead wires. Accordingly, even in both cases where the fan unit is conveyed discretely and where the fan unit is combined with other components, for conveyance, the lead wires will not become an obstacle to the conveyance. In the present invention in particular, the lead wires are held on the outer wall of the fan unit. Thus, even when the fan unit with other components such as a fan holder or a heat sink is combined as well as when the fan unit is conveyed, the lead wires will not become an obstacle to the work.

The structure of each of the lead wire engaging sections is arbitrary. For example, each of the lead wire engaging sections can be structured to have: a lead-wire-inserting opening through which a part of the lead wires inserted thereinto; and a pair of lead-wire-extending openings formed to be continuous with the lead-wire-inserting opening in both directions intersecting a direction in which the part of the lead wires is to be inserted through the lead-wire-inserting opening, for allowing the lead wires to extend therethrough. With this structure, just by inserting the lead wires through the lead-wire-inserting opening, the lead wires can be sequentially engaged into the lead wire engaging sections. Further in this case, preferably, each of the lead wire engaging sections is configured to keep engaging the part of the lead wires when a force for pulling out the part of the lead wires through the lead-wire-inserting opening is not intentionally applied to the lead wires inserted through the lead-wire-inserting opening. With this arrangement, the lead wires can be firmly prevented from falling out.

When fan casing is located in the more backward direction than the motor supporting member and when the outer wall section of the fan casing includes an outer peripheral surface extending in both of the axial direction and a peripheral direction surrounding the periphery of the revolving shaft, it is preferable that all of the lead wire engaging sections are provided on the outer peripheral surface of the outer wall section at the intervals in the peripheral direction. In this case, the lead wire engaging sections include a first lead wire engaging section into which the lead wires are to be first inserted, a last lead wire engaging section, arranged next to the first lead wire engaging section, into which the lead wires are to be last inserted, and one or more intermediate lead wire engaging sections arranged between the first lead wire engaging sections and the last lead wire engaging section. Then, the lead-wire-inserting opening of the first lead wire engaging sections is open toward the backward direction, and the pair of lead-wire-extending openings are open at both sides of the outer wall section toward both of the peripheral directions of the outer wall. When this structure is adopted, the lead wires are extended from the motor and are then pulled from the motor supporting member to the fan casing. Then, the lead wires are inserted into the first lead wire engaging section and are bent in the form of an L shape in the vicinity of one of the lead-wire-extending openings of the first lead wire engaging section. The lead wires are then arranged along the outer peripheral surface of the outer wall section. In the first lead wire engaging section, the lead wires are bent in the form of the L shape, so that the lead wires are securely engaged into the first lead wire engaging section. As a result, even if a tensile force is applied to the lead wires in subsequent work, the tensile force is applied to the bent portions of the lead wires. For this reason, the tensile force will not be directly applied to connecting portions between the lead wires and the terminal electrode in the motor, so that a disconnection of the lead wires will not occur. Incidentally, when the lead wires are arranged along one of the webs, it is preferable that the first lead wire engaging section is arranged adjacent to the one of the webs. With this arrangement, the lead wires can be wound along the outer peripheral surface of the fan casing without being pulled around unnaturally or longer than necessary.

Preferably, the lead-wire-inserting opening of the one or more intermediate lead wire engaging sections are open in the backward direction and the pair of lead-wire-extending openings of the one or more intermediate lead wire engaging sections are open toward the both sides of the outer wall section in the peripheral directions of the outer wall. With this structure, the lead wires can be easily inserted into the intermediate lead wire engaging section, and can also be smoothly arranged along the outer peripheral surface of the fan casing.

Specifically, it is preferable that each of the first lead wire engaging section and the one or more intermediate lead wire engaging sections includes: a protruding portion protruding from the outer peripheral surface of the outer wall section of the fan casing in a radially outward direction; and a holding portion integrally provided at the distal end of the protruding portion and extending in the backward direction. In this case, the part of the lead wires is sandwiched or hold between the holding portion and the outer peripheral surface. With this arrangement, the part of the lead wires becomes engaged into the first lead wire engaging section or the intermediated lead wire engaging section. In this case, the lead-wire-inserting opening is formed between the distal end surface of the holding portion and the outer peripheral surface, and the pair of the lead-wire-extending openings are formed by two space portions formed by being surrounded by the outer peripheral surface of the fan casing, two end surfaces located on both sides of the protruding portion in the peripheral directions, and two end surfaces located on both sides of the holding portion in the peripheral direction. When the first lead wire engaging section and the intermediated lead wire engaging section have the structure described above, the lead wires can be easily engaged into the first lead wire engaging section and the intermediate lead wire engaging section. Further, with this structure, even when the lead wires are to be taken out of the fan casing, the lead wires can be easily disengaged from the first lead wire engaging section and the intermediate lead wire engaging section.

Between the respective two adjacent lead wire sections of the lead wire engaging sections including the first and last lead wire engaging sections and the one or more intermediate lead wire engaging section, one or more lead wire supporting sections in contact with a part of the lead wires, for supporting the part of the lead wires may be provided, so that the lead wires do not move in the backward direction. When such the lead wire supporting section is provided, a lead wire that is coming out of the lead wire engaging section will be supported by the lead wire supporting section, for example. Thus, at whatever position the fan unit is conveyed, the lead wires can be prevented from being disconnected from the fan casing.

When the fan unit is mounted to the heat sink to constitute a heat-emitting element cooling apparatus, a plurality of mounting engaging sections used for mounting the fan unit on the heat sink may also be used as the lead wire supporting sections. With this arrangement, a plurality of lead wire supporting sections can be provided without complicating the structure of the fan casing.

The structure of the last lead wire engaging section is arbitrary. Preferably, the lead-wire-inserting opening of the last lead wire engaging section is open in a direction in which the first lead wire engaging section is located, or one of the peripheral directions of the outer wall section, and the pair of lead-wire-extending openings of the last lead wire engaging section are open both in the forward direction and in the backward direction, for example. With this arrangement, by inserting a part of the free end portions of the lead wires into the lead-wire-inserting opening of the last lead wire engaging section, the free end portions may be arranged in the forward or backward direction. As a result, the free end portions, which are bent in the form of the L shape, will be engaged into the last lead wire engaging section. Thus, it becomes difficult for the free end portions to be disengaged from the last lead wire engaging section. Further, the free end portions can be arranged, being always oriented in either of the forward and backward directions. Thus, when a plurality of fan units or a plurality of heat-emitting element cooling apparatus is collected for conveyance, the free end portions of the lead wires can be engaged into the last lead wire engaging section, being oriented in the forward direction. With this arrangement, the fan units or the heat-emitting element cooling apparatuses can be collected for conveyance with no free end portions hitting other fan unit or heat-emitting element cooling apparatus adjacent thereto. As a result, the connector or the like provided for the free end portions of the lead wires can be effectively prevented from being damaged in the process of the conveyance.

Preferably, the first lead wire engaging section includes: a protruding portion extending from the outer peripheral surface in a radially outward direction; and a holding portion integrally provided at the distal end of the protruding portion and extending in the peripheral direction. With this arrangement, the part of the lead wires is engaged into the last lead wire engaging section, being sandwiched or held between the holding portion and the outer peripheral surface of the fan casing. Further, the lead-wire-inserting opening is formed between the distal end surface of the holding portion and the outer peripheral surface. Then, the pair of the lead-wire-extending openings is formed by two space portions formed by being surrounded by the outer peripheral surface, two end surfaces located at both sides of the protruding portion both in the forward and backward directions, and two end surfaces located at both sides of the holding portion both in the forward and backward directions.

At the distal end of the holding portion, a protrusion protruding toward the outer peripheral surface and preventing the part of the lead wires located between the holding portion and the outer peripheral surface from coming out through the lead-wire-inserting opening may be integrally provided. With this arrangement, even if the free end portions of the lead wires have the property of a spring or resilience for restoration to an original shape, the existence of the protrusion can prevent the part of the lead wires from coming out of the last lead wire engaging section.

Preferably, in the one of the webs, lead wire receiving grooves being open toward both sides of a direction in which the one of the webs extends and in the forward direction, for receiving the lead wires are formed. Then, it is preferable that a lead wire coming-out prevention structure is integrally provided at the ends of the one of the webs located in the radially outward direction of the one of the webs. The lead wire coming-out prevention structure allows the lead wires to be received within the lead wire receiving grooves but prevents the lead wires from coming out of the lead wire receiving grooves when the lead wires are bent in the backward direction.

The structure of a heat-emitting element cooling apparatus of the present invention including the fan unit of the present invention is as follows:

The heat-emitting element cooling apparatus includes: a heat sink having a base for absorbing heat from a heat emitting element and a plurality of radiation fins wholly or partially fixed to the base; and a fan unit disposed over the heat sink, for blowing air along the radiation fins to promote heat dissipation from the radiation fins. Then, the fan unit is an axial-flow fan unit including: a motor having a revolving shaft; a motor supporting member located in the more forward direction than the revolving shaft, for supporting the motor; an impeller having a plurality of blades and mounted on the revolving shaft, for rotation, the impeller being located in the more backward direction than the motor supporting member; a fan casing having a cylindrical venturi with the impeller rotatably received therein; and a plurality of lead wires connected to the motor. A plurality of lead wire engaging sections are provided at the outer wall section of the fan casing. The lead wire engaging sections are arranged at predetermined intervals along a contour of the motor wall when the fan casing is viewed from a predetermined position located in the forward direction. The lead wire engaging sections are so configured to engage a part of lead wires respectively and are used so as to prevent the lead wires from coming out of the fan casing one or more during conveyance.

The fan unit is mounted on the heat sink through engagement structures for mounting. The engagement structures for mounting include: a plurality of mounting engaging sections integrally provided on the fan casing; and a plurality of mounting engaged sections provided on the heat sink, for being engaged with the mounting engaging sections. The mounting engaging sections are arranged between respective two adjacent two lead wire sections of the lead wire engaging sections. Some mounting engaging sections of the mounting engaging sections constitute lead wire supporting sections being each located between the two adjacent lead wire sections in the lead wire engaging sections including the first one of the lead wire engaging sections located adjacent to the one of the webs and the last one of the lead wire engaging sections located next to the first one of the lead wire engaging sections. The lead wire supporting sections are in contact with parts of the lead wires, for supporting the parts of the lead wires, so that the lead wires do not move in the backward direction. The lead wires are first inserted into the first one of the lead wire engaging sections and are last inserted into the last one of the lead wire engaging sections.

Preferably, air flow passages being open in the forward direction, in the backward direction, and in an outward direction intersecting the two directions and extending outwards are formed between respective two adjacent radiation fins of the radiation fins of the heat sink. In this case, the mounting engaging sections can be constituted by a plurality of mounting engaging sections of a first type and a plurality of mounting engaging sections of a second type. The mounting engaging sections of the first and second types are integrally provided on the outer wall section of the fan casing and extend in the backward direction along the end edges of the radiation fins located in the outward direction. The bases of the mounting engaging sections of the first type are integrally fixed to the outer wall section, and each of the mounting engaging sections of the first type includes a hook at its distal end. The hook engages one of the mounting engaged sections formed at some of the radiation fins and prevents the fan casing from moving in the forward direction with respect to the heat sink. The bases of the mounting engaging sections of the second type are integrally fixed to the outer wall section of the fan casing and each of the mounting engaging sections of the second type includes one or more protrusion fitted into one of the air flow passages formed between one of the two adjacent radiation fins of the radiation fins, for preventing the fan casing from rotating with respect to the axial of the revolving shaft. By providing the mounting engaging sections of the second type in addition to the mounting engaging sections of the first type, the fan unit can be mounted to the radiation fins of the heat sink without rattling.

Specifically, a pair of the mounting engaging sections of the second type is arranged to face each other so that the heat sink is sandwiched therebetween. Then, the one or more protrusion is integrally provided on each of the mounting engaging sections of the second type in a position adjacent to its base. Further, the inner surface of a portion of each of the mounting engaging sections of the second type located in the more backward direction than a portion of each of the mounting engaging sections of the second type having the one or more protrusion is so inclined as to be away further from the radiation fins as the inner surface becomes closer to the end surface thereof in the backward direction. With this arrangement, when the fan unit is relatively moved toward the heat sink, the protrusion is moved to the air flow passage formed between the two adjacent radiation fins with the inclined inner surfaces guided along the angular portions of some of the radiation fins while being in contact with the some of the radiation fins. The protrusions can thereby be entered into the air flow passages smoothly.

In this case, it is preferable that a pair of the mounting engaging sections of the first type are arranged to face each other so that the heat sink is sandwiched therebetween. Then, the pair of mounting engaging sections of the first type and the pair of mounting engaging sections of the second type are arranged so that a first virtual connecting line connecting the pair of the mounting engaging sections of the first type is perpendicular to a second virtual connecting line connecting the pair of the mounting engaging sections of the second type. With this arrangement, the fan unit can be mounted on the heat sink using the least number of the mounting engaging sections of the first and second types.

The mounting engaged sections can be formed by notching the end edges of some adjacent radiation fins of the radiation fins in a direction in which the radiation fins are located. With this arrangement, it becomes unnecessary to provide the mounting engaged sections as additional members.

Though the structure of the heat sink is arbitrary, the base may be extended in the axial direction, and the radiation fins may be extended radially from the base in an outward direction. In this case, preferably, the radiation fins are curved in one of the peripheral directions of the revolving shaft. Then, the shape of the blades provided on the impeller of the fan unit is so defined as to generate a flow of air that flows in the axial direction while rotating in the other of the peripheral directions. With this arrangement, the cooling performance of the heat-emitting element apparatus can be increased.

According to the present invention, just by engaging the lead wires into the lead wire engaging sections arranged along the contour of the outer wall section of the fan casing, the lead wires can be attached to the fan casing without an undue force applied or great deformation caused in the lead wires. Accordingly, even in both cases where the fan unit is conveyed discretely and where the fan unit is combined with other components, for conveyance, the lead wires will not become an obstacle to the conveyance. In the present invention in particular, the lead wires are held on the side of the fan unit. Thus, even when the work of combining the fan unit with other components such as a fan holder or a heat sink is performed as well as when the fan unit is conveyed, the lead wires will not become an obstacle to the work.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF PREFERRED EMBODIMENT

Figure 1A:
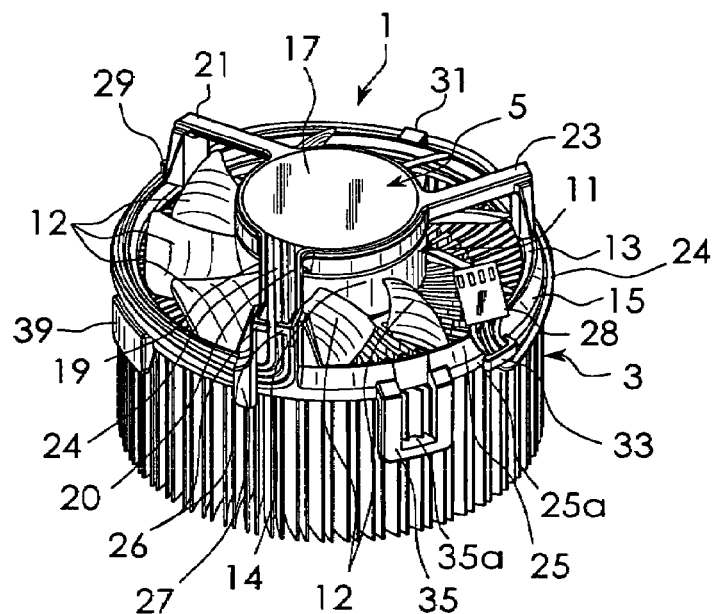
FIG. 1(A) is a perspective view of a heat-emitting element cooling apparatus according to an embodiment of the present invention, in which a fan unit according to the embodiment of the present invention is mounted on a heat sink.
Figure 1B:
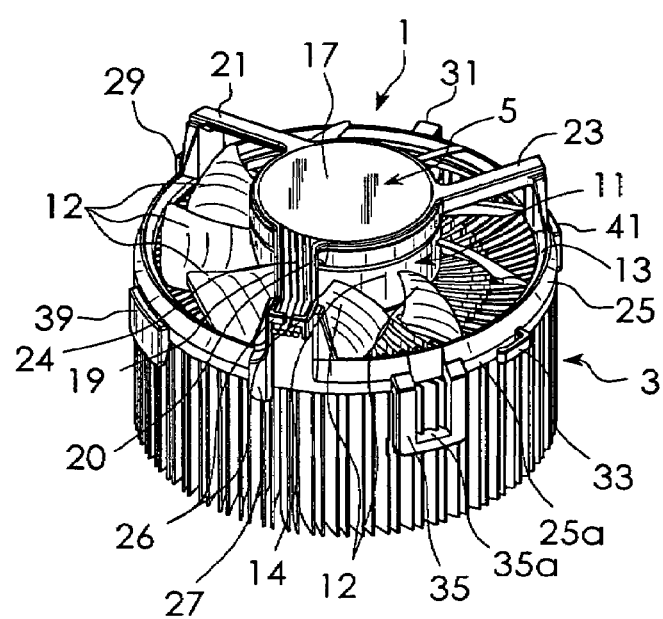
FIG. 1(B) is a perspective view showing a state in which a plurality of lead wires have been cut midway in the embodiment shown in FIG. 1(A)
Figure 2A:
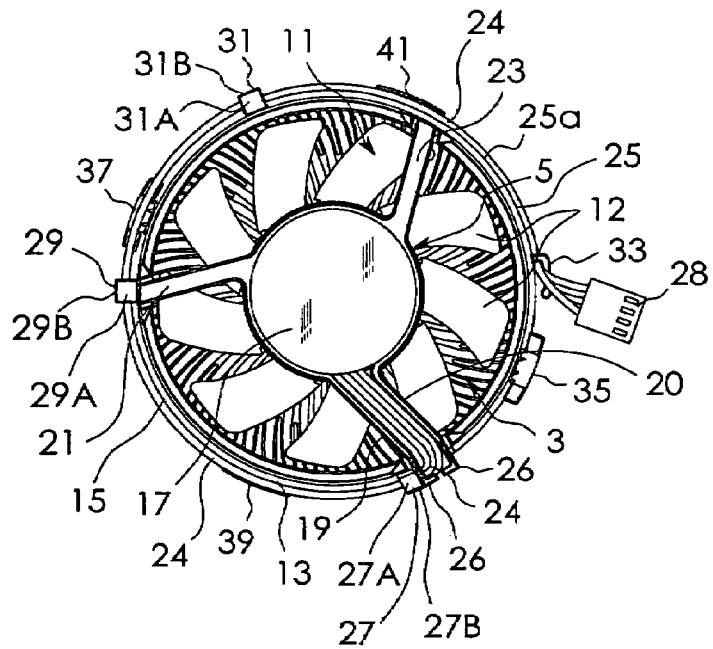
FIG. 2(A) is a top plan view of the embodiment shown in FIG. 1(A)
Figure 2B:
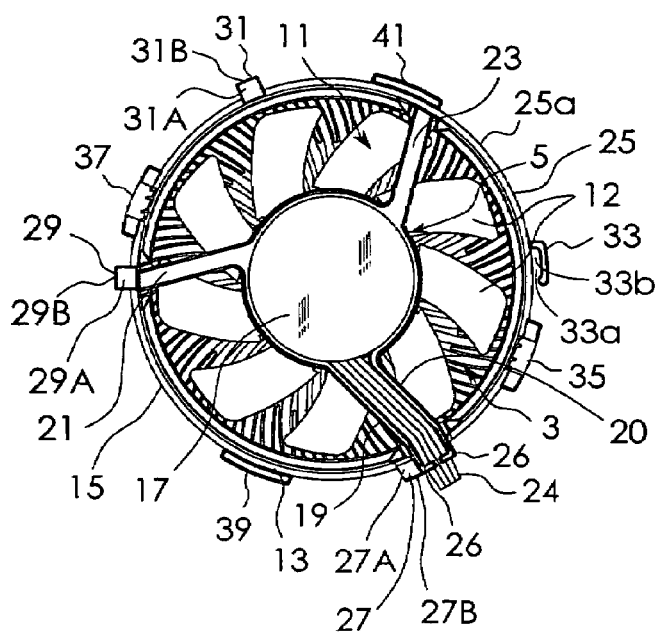
FIG. 2(B) is a top plan view showing the state in which the lead wires have been cut midway in the embodiment shown in FIG. 2(A)
Figure 3A:
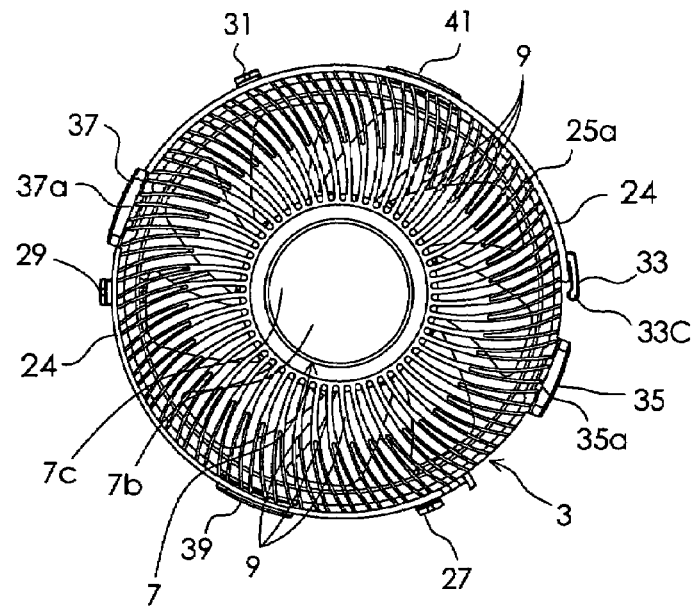
FIG. 3(A) is a bottom plan view of the embodiment in FIG. 1(A)
Figure 3B:
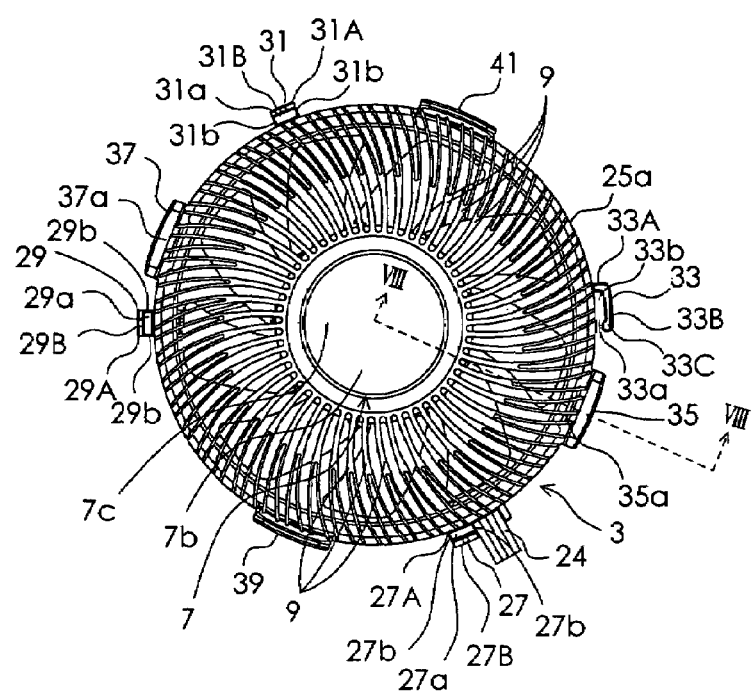
FIG. 3(B) is a bottom plan view showing the state in which the lead wires have been cut midway in the embodiment shown in FIG. 3(A)
Figure 4:
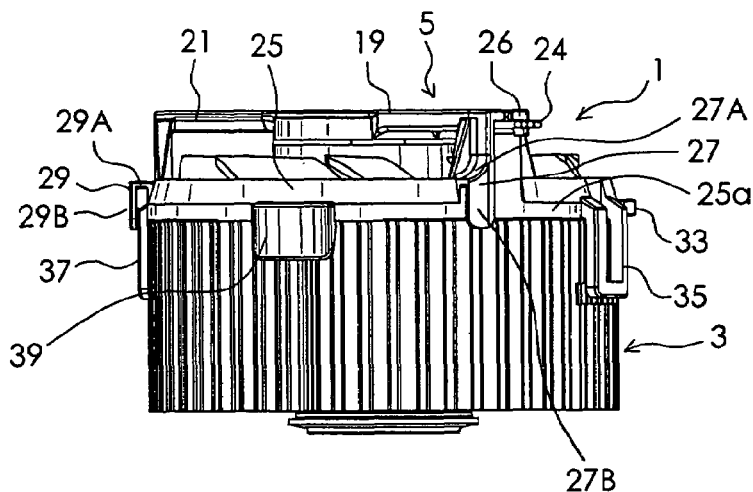
FIG. 4 is a front elevation view showing the state in which the lead wires have been cut midway in the embodiment shown in FIG. 1(A)
Figure 5:
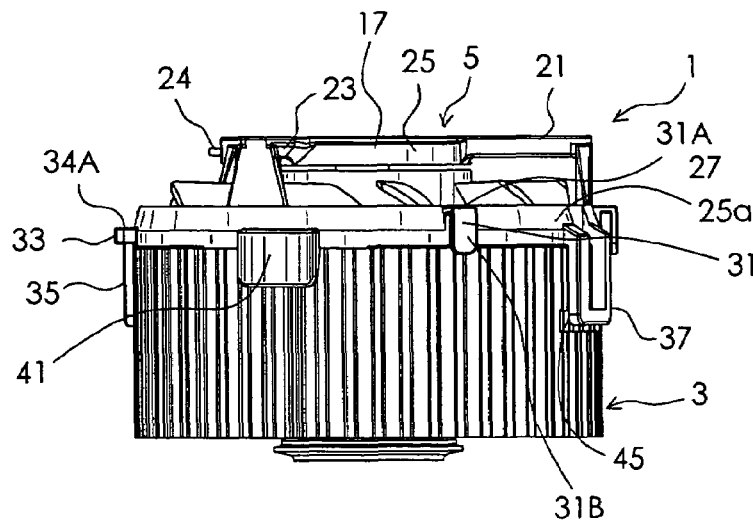
FIG. 5 is a rear elevation view showing the state in which the lead wires have been cut midway in the embodiment shown in FIG. 1(A)
Figure 6:
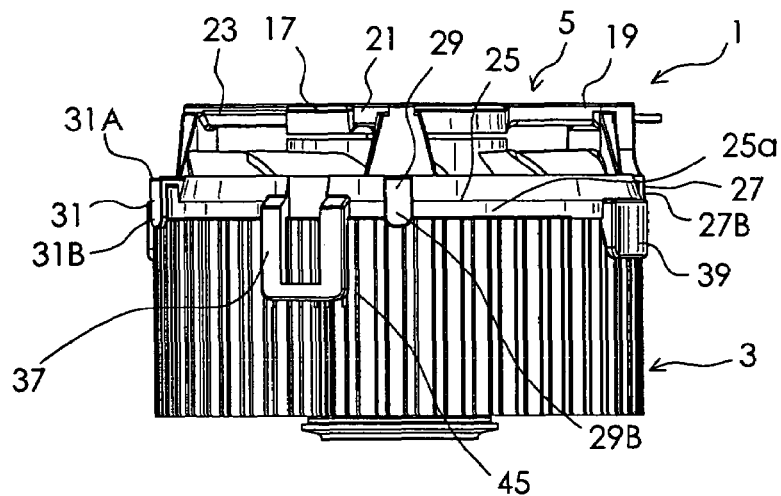
FIG. 6 is a left-side elevation view showing the state in which the lead wires have been cut midway in the embodiment shown in FIG. 1(A)
Figure 7:
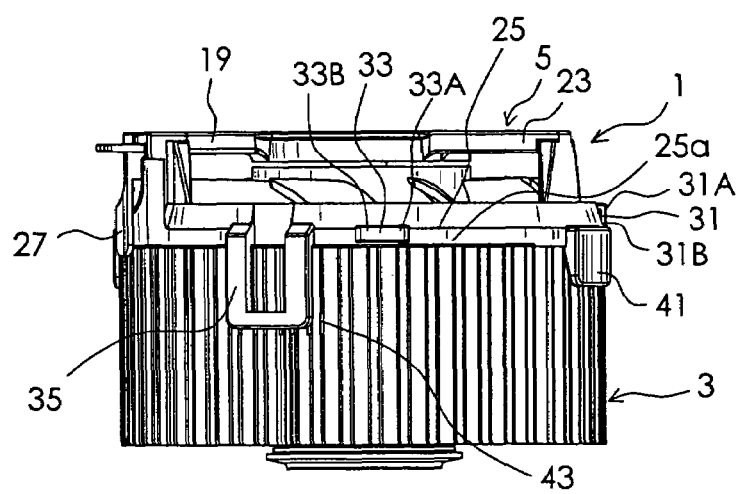
FIG. 7 is a right-side elevation view showing the state in which the lead wires have been cut midway in the embodiment shown in FIG. 1(A)
Figure 8:
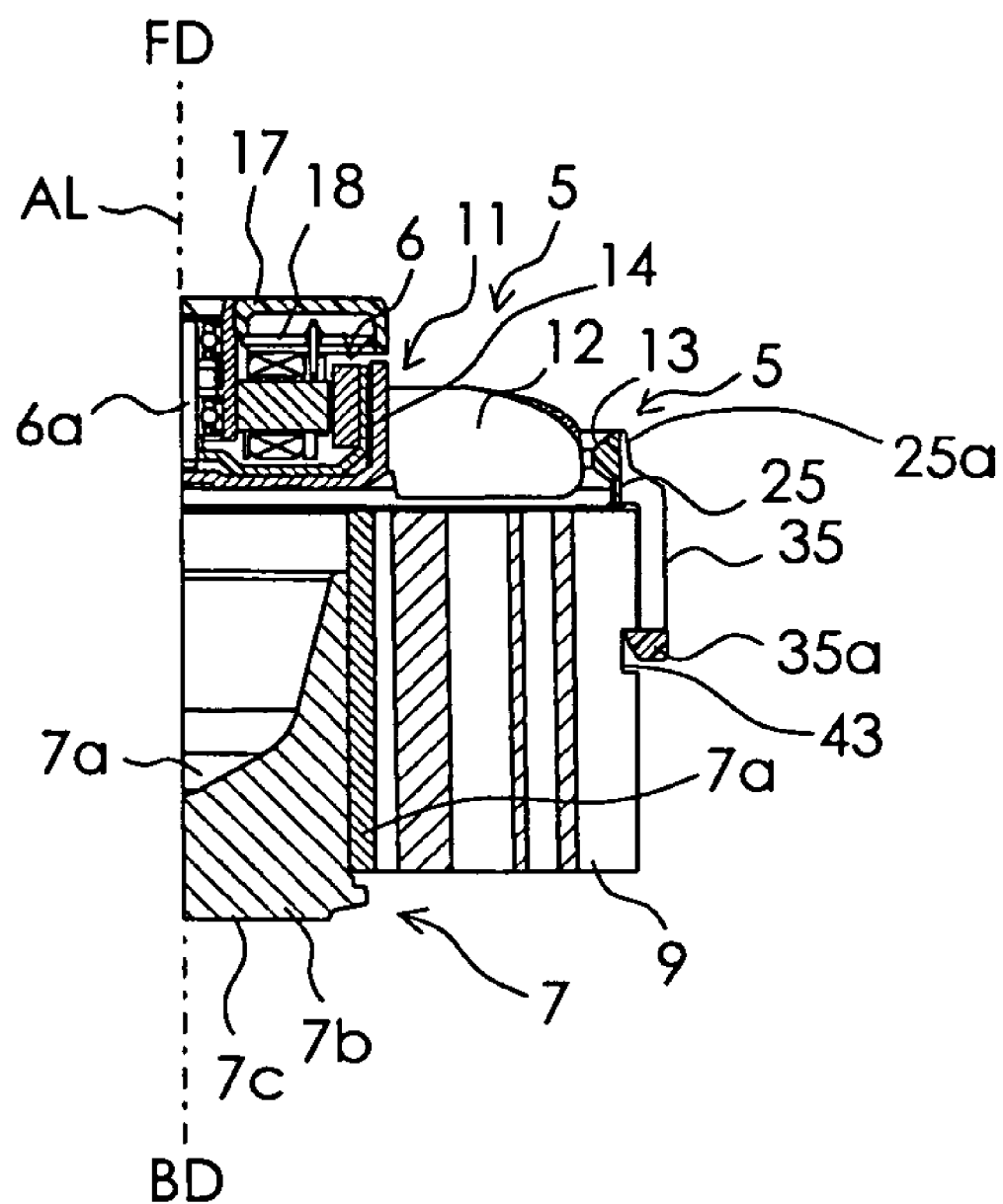
FIG. 8 is a schematic sectional view of FIG. 3(B) cut along a line VIII-VIII.

An embodiment of the present invention will be described in detail with reference to the appended drawings. FIG. 1(A) is a perspective view of a heat-emitting element cooling apparatus according to the embodiment of the present invention in which a fan unit according to the embodiment of the present invention is mounted on a heat sink. FIG. 1(B) is a perspective view showing a state in which a plurality of lead wires have been cut midway in the embodiment shown in FIG. 1(A). FIG. 2(A) is a top plan view of the embodiment shown in FIG. 1(A), while FIG. 2(B) is a top plan view showing the state in which the lead wires have been cut midway in the embodiment shown in FIG. 2(A). FIG. 3(A) is a bottom plan view of the embodiment in FIG. 1(A), while FIG. 3(B) is a bottom plan view showing the state in which the lead wires have been cut midway in the embodiment shown in FIG. 3(A). FIGS. 4 through 7 are a front elevation view, a rear elevation view, a left-side elevation view, and a right-side elevation view showing the state in which the lead wires have been cut midway in the embodiment shown in FIG. 1(A). As shown in each of the drawings, a heat-emitting element apparatus (or an electronic component cooling apparatus) 1 according to this embodiment includes a heat sink 3 and a fan unit 5. As illustrated in FIG. 8, this fan unit 5 is an axial-flow fan unit in which a flow of air generated by rotation of an impeller 11 mounted on a revolving shaft 6a of a motor 6, which will be described later, is directed toward an axial direction of the rotating shaft 6a. In this specification, one of two axial directions of the revolving shaft 6a (an upward direction in the drawings) is defined as a "forward direction", while the other of the two axial directions (a downward direction in the drawings) is defined as a "backward direction". Accordingly, in this embodiment, the fan unit 5 is located in the more forward direction than the heat sink 3.

As illustrated well in FIG. 3, the heat sink 3 includes a base 7 and a plurality of radiation fins 9 fixed to the base 7. As illustrated in FIG. 8, the base 7 is constituted by a cylindrical hollowed central section 7a including a cavity in its inside that extends in the direction of the revolving shaft 6a of the motor 6 and a high thermal conductor 7b that is fit into the cavity and arranged so that it can conduct heat to the hollowed central section 7a. The high thermal conductor 7b is formed of a material having a thermal conductivity higher than that of a material employed for forming the hollowed central section 7a. Specifically, the high thermal conductor 7b is formed of copper having a thermal conductivity higher than the thermal conductivity of the material (i.e. aluminum) for the radiation fins 9 and the hollowed central section 7a.

As illustrated in FIG. 3, the radiation fins 9 are integrally fixed to the outer periphery of the base 7. A heat-emitting element constituted by an electronic component to be cooled is mounted on the rear surface of the base 7 or a bottom surface 7c opposite to the side where the axial-flow fan unit 5 is located. In this heat sink 3, all the bases of the radiation fins are integrally fixed to the outer periphery of the base 7. Each of the radiation fins 9 is curved in one of peripheral directions of the revolving shaft 6a with respect to the axial of the revolving shaft 6a. Then, each of the radiation fins 9 is branched midway into two at its ends.

As illustrated in FIGS. 1, 2, and 8, the fan unit 5 includes an impeller 11 mounted on the revolving shaft 6a of the motor 6, a fan casing 15 including a venturi 13 for rotatably receiving the impeller 11, a motor supporting member 17 for supporting the motor 6, and three webs 19, 21, and 23 that couple the motor supporting member 17 to the fan casing 15. The impeller 11 includes nine blades 12 and a cup-like blade mounting section 14, and is driven for rotation by the motor 6. This fan unit 5 draws in air from the side where the webs 19, 21 and 23 are located, and operates so that the air is blown toward the radiation fins 9.

Four lead wires 24 that are connected to the motor 6 and extend outside the motor supporting member 17 are arranged along the web 19, which is one of the three webs 19, 21, and 23 provided at intervals in the peripheral direction of the revolving shaft 6a. Respective one end of the four lead wires 24 are soldered to a plurality of electric terminals provided at a motor driving circuit 18 arranged within the motor supporting member 17. In this embodiment, the four lead wires 24 are kept away from one another. The lead wires 24, however, may be of course mutually combined to form a wire harness. To the other ends of the four lead wires 24, a connector 28 as illustrated in FIGS. 1(A) and 2(A) is connected. As illustrated in FIGS. 1 and 2, lead wire receiving grooves 20 are formed in the web 19 along which the four lead wires 24 are arranged. The lead wire receiving grooves 20 are open toward the forward direction and toward both directions in which the web 19 extends, and receive the four lead wires 24. A pair of locking pieces 28 is integrally provided at the end of the web 19 in the radially outward direction of the web 19. The pair of locking pieces 26 constitutes a lead wire coming-out prevention structure that prevents the four lead wires 24 from coming out of the lead wire receiving grooves 20 when the four lead wires 24 are bent in the backward direction, though allowing the four lead wires 24 to be received within the lead wire receiving grooves 20.

The shape of the blades 12 provided at the impeller 11 of the fan unit 5 is so defined that the flow of the air generated by rotation of the revolving shaft 6a is rotated in a direction opposite to the direction in which the radiation fins 9 of the heat sink 3 described above are curved. Since this configuration is already known, its description will be omitted. In this embodiment, the fan casing 15, motor supporting member 17, and webs 19, 21, and 23 are integrally formed using a molding compound mainly made of a synthetic resin material. The fan unit 5 is mounted on the heat sink 3 so that the rotational center of the revolving shaft 6a is substantially aligned with the center of the base 7 of the heat sink 3.

As illustrated in FIGS. 1 to 3 and FIG. 8 in detail, the fan casing 15 is constituted by a cylindrical venture 13 for rotatably receiving the impeller 11, a cylindrical outer wall section 25 that is located outside the venturi 13 to face the upper end edge portion of the heat sink 3, four lead wire engaging sections 27, 29, 31 and 33 integrally provided on the outer wall section 25, a pair of mounting engaging sections 35 and 37 of a first type integrally provided on the outer wall section 25, a pair of mounting engaging sections 39 and 41 of a second type integrally provided on the outer wall section 25.

The four lead wire engaging sections 27, 29, 31 and 33 are integrally provided at the outer wall section 25. The four lead wire engaging sections 27, 29, 31 and 33 are spaced at predetermined intervals along the contour of the outer wall section 25, which is substantially circular, of the fan casing 15 as the fan casing 15 is viewed from a predetermined position located in the forward direction. The predetermined position is the one through which the axial of the revolving shaft 6a extended in the forward direction passes.

The four lead-wiring engaging sections 27, 29, 31 and 33 are constituted by the first lead wire engaging section 27 into which the four lead wires 24 are first inserted, the last lead wire engaging section 33 arranged next to the first lead wire engaging section 27 and into which the four lead wires 24 are last inserted, and the two intermediate lead wire engaging sections 29 and 31 arranged between the first lead wire engaging section 27 and the last lead wire engaging section 33. These lead wire engaging sections 27, 29, 31 and 33 respectively include lead-wire-inserting openings 27a, 29a, 31a and 33a, and pairs of lead-wire-extending openings 27b, 29b, 31b and 33b. Parts of the four lead wires 24 are inserted through the lead-wire-inserting openings 27a, 29a, 31a and 33a. Each of the pairs of lead-wire-extending openings 27b, 29b, 31b and 33b is formed to be continuous with the lead-wire-inserting openings 27a, 29a, 31a and 33a respectively, and located at both sides of the lead wire engaging sections in a direction intersecting the direction in which the parts of the four lead wires 24 are inserted through the lead-wire-inserting openings 27a, 29a, 31a and 33a. The four lead wires 24 extend from the pairs of the lead wire extending openings 27b, 29b, 31b and 33b.

Specifically, as illustrated in FIGS. 2 and 3, the first lead wire engaging section 27 and the intermediate lead wire engaging sections 29 and 31 include protruding portions 27A, 29A and 31A, respectively, which protrude in the radially outward direction from an outer peripheral surface 25a of the outer wall section 25 of the fan casing 15, and holding portions 27B, 29B and 31B integrally provided at the distal ends of the protruding portions 27A to 31A and extend in the backward direction. A part of the four lead wires 24 is sandwiched or hold between the outer peripheral surface 25a of the fan casing 15 and the holding portions 27B, 29B, or 31B. With this arrangement, the part of the four lead wires 24 is engaged into the first lead wire engaging section 27 or the intermediate lead wire engaging section 29 or 31. In this case, the lead-wire-inserting openings 27a, 29a and 31a are formed between the outer peripheral surface 25a of the fan casing 15 and the distal end surfaces of the holding portions 27B, 29B and 31B, respectively. Further, two space portions formed by the two end surfaces located on both sides of the protruding portion 27A in the peripheral direction, the two end surfaces located on both sides of the holding portion 27B in the peripheral direction, and the outer peripheral surface 25a of the fan casing 15 constitute the pairs of the lead-wire-extending openings 27b. Two space portions formed by the two end surfaces located on both sides of the protruding portion 29A in the peripheral direction, the two end surfaces located on both sides of the holding portion 29B in the peripheral direction, and the outer peripheral surface 25a of the fan casing 15 constitute the pairs of the lead-wire-extending openings 29b. Then, two space portions formed by the two end surfaces located on both sides of the protruding portion 31A in the peripheral direction, the two end surfaces located on both sides of the holding portion 31B in the peripheral direction, and the outer peripheral surface 25a of the fan casing 15 constitute the pairs of the lead-wire-extending openings 31b.

The last lead wire engaging section 33 has a structure where the lead-wire-inserting opening 33a is open toward the direction in which the first lead wire engaging section 27 is located or one of the peripheral directions of the outer wall section 25, which corresponds to a clockwise direction in the states shown in FIGS. 2 and 3, and the pair of lead-wire-extending openings 33b are open toward both of the forward direction and the backward direction. With this structure, by inserting the part of the free end portions of the four lead wires 24 (end portions for which the connector 28 is provided) through, the lead-wire-inserting opening 33a of the last lead wire engaging section 33, the free end portions for the connector 28 can be arranged, being oriented toward the forward direction or the backward direction. As a result, the free end portions, which are bent in the form of an L shape, will be engaged into the last lead wire engaging section 33. With this arrangement, it becomes difficult for the free end portions of the four lead wires 24 for the connector 28 to be disengaged from the last lead wire engaging section 33. Further, the free end portions for the connector 28 can be arranged, being always oriented toward either of the forward and backward directions. Thus, when a plurality of fan units or a plurality of heat-emitting element cooling apparatus is collected for conveyance, the free end portions of the lead wires 24 for the connector 28 of each of the fan units or the heat-emitting element cooling apparatuses can be engaged into the last lead wire engaging section 33, being oriented toward the forward direction. With this arrangement, the plurality of fan units or the plurality of heat-emitting element cooling apparatuses can be conveyed with no connectors 28 hitting other fan units or heat-emitting element cooling apparatus adjacent thereto. As a result, the connector 28 or the like provided for the free end portions of the lead wires 24 can be effectively prevented from being damaged in the process of the conveyance.

Specifically, the last lead wire engaging section 33 includes a protruding portion 33A that protrudes in the radially outward direction from the outer peripheral surface 25a of the fan casing 15 and a holding portion 33B integrally which is provided at the distal end of the protruding portion 33A and extends in the peripheral direction of the outer wall section. A part of the four lead wires 24 is engaged into the last lead wire engaging section 33 with the part of the lead wires 24 sandwiched or hold between the holding portion 33B and the outer peripheral surface 25a of the fan casing 15. The lead-wire-inserting opening 33a is formed between the distal end surface of the holding portion 33B and the outer peripheral surface 25a. Then, the pair of the lead-wire-extending openings 33b is formed by two space portions formed by the outer peripheral surface 25a of the fan casing 15, two end surfaces located on both sides of the protruding portion 33A in the forward and backward directions, and two end surfaces located on both sides of the holding portion 33B in the forward and backward directions. As illustrated in FIGS. 2 and 3, a protrusion 33C is integrally provided at the distal end of the holding portion 33B of the last lead wire engaging section 33 in this embodiment. The protrusion 33C protrudes toward the outer peripheral surface 25a of the fan casing 15 and prevents the part of the lead wires 24 located between the holding portion 33B and the outer peripheral surface 25a from coming out of the lead-wire-inserting opening 33a.

When the first lead wire engaging section 27, intermediate lead wire engaging sections 29 and 31 and last lead wire engaging section 33 have the structures described above as in this embodiment, the four lead wires 24 can be easily engaged into the first lead wire engaging section 27, intermediate lead wire engaging sections 29 and 31, and last lead wire engaging section 33. Further, with the structures described above, the four lead wires 24 can be easily disengaged from each of the lead wire engaging sections to be released from the fan casing 15.

Further, when the first lead wire engaging section 27 has the structure in which the lead-wire-inserting opening 27$a$ is open toward the backward direction or toward the direction in which the heat sink 3 is oriented and the pair of the lead-wire-extending openings 27$b$ are open toward both sides of the outer wall section 25 in the peripheral direction, as described above, the following effect can be obtained. After pulled round toward the fan casing 15 from the external end portion of the web 19, the four lead wires 24 inserted into the first lead wire engaging section 27 are bent in the form of the L shape in the vicinity of the lead-wire-extending openings 27$b$ located on the side of the web 19. Then, the lead wires 24 are arranged along the outer peripheral surface 25$a$ of the outer wall section 25. In the first lead wire engaging section 27, the four lead wires 24 are bent in the form of the L shape, so that the four lead wires 24 are securely engaged into the first lead wire engaging section 27. As a result, even if a tensile force is applied to the four lead wires 24 in subsequent work, the tensile force is applied to the bent portion at which the lead wires are bent. For this reason, the tensile force will not be directly applied to connecting portions between the four lead wires 24 and the electric terminals on the side of the motor, so that a bad connection of the lead wires will not occur.

In this embodiment, the mounting engaging section 39 of the second type between the first lead wire engaging section 27 and the intermediate lead wire engaging section 29, the mounting engaging section 37 of the first type between the intermediate lead wire engaging section 29 and the intermediate lead wire engaging section 31 and the mounting engaging section 41 of the second type between the intermediate lead wire engaging section 31 and the last lead wire engaging section 33 constitute lead wire supporting sections that are in contact with parts of the four lead wires 24 and then support the parts of the four lead wires, so that the four lead wires 24 do not move in the backward direction. When such lead wire supporting sections are provided, the lead wires 24 that are coming out of the lead wire engaging sections 27, 29 and 31 will be supported by the lead wire supporting sections 37, 39 and 41. Thus, the lead wires 24 can be prevented from coming out of the fan casing 15 in whatever posture the fan unit is placed for conveyance.

Preferably, each of the lead wire engaging sections 27, 29 and 31 is so constituted as to maintain the state of the engagement with a part of the lead wires 24 when a force for pulling out the part of the lead wires 24 from the lead-wire-inserting openings 27$a$, 29$a$ and 31$a$, which have been inserted through the lead-wire-inserting openings 27$a$, 29$a$ and 31$a$, is not intentionally applied. Specifically, dimensions of a space between the outer peripheral surface 25$a$ of the fan casing 15 and each of the holding portions 27B, 29B and 31B may be so defined that the lead wires 24 become strongly sandwiched or held between both of the outer peripheral surface 25$a$ and each of the holding portions 27B, 29B and 31B. Incidentally, when the lead wire supporting sections (37, 39, 41) described above are provided as in this embodiment, the lead wire engaging sections 27, 29 and 31 do not need to sandwich or hold the lead wires 24 strongly.

The fan unit 5 is mounted on the heat sink 3 through mounting engagement structures. These mounting engagement structures are constituted by the four mounting engaging sections 35, 37, 39 and 41 described above, integrally provided on the fan casing 15, and the four engaged sections provided at the heat sink 3, with which the four mounting engaging sections 35, 37, 39 and 41 are engaged, respectively.

Each of the four mounting engaging sections 35, 37, 39 and 41 is arranged between the respective adjacent two lead wire engaging sections of the lead wire engaging sections 27, 29, 31 and 33. As described above, the three mounting engaging sections 37, 39 and 41 of these four lead wire engaging sections 35, 37, 39 and 41 constitute the lead wire supporting sections that come into contact with the parts of the four lead wires 24 and then supports the parts of the four lead wires so that the four lead wires 24 do not move in the backward direction.

The four mounting engaging sections 35, 37, 39 and 41 can be constituted by the pair of the mounting engaging sections 35 and 37 of the first type and the pair of the mounting engaging sections 39 and 41 of the second type. The four mounting engaging sections 35, 37, 39, and 41 are integrally provided on the outer wall section 25 of the fan casing 15 and extend in the backward direction (downward direction in the drawings) along the end edges of the radiation fins 9 located in an external direction. The bases of the mounting engaging sections 35 and 37 of the first type are integrally fixed to the outer wall section 25 and have a U shape. Then, as illustrated in FIGS. 8 and 9, hooks 35$a$ and 37$a$ are provided at the distal end portions of the mounting engaging sections 35 and 37, respectively. These hooks 35$a$ and 37$a$ engages mounting engaged sections 43 and 45 formed in a plurality of the radiation fins 9, respectively, thereby preventing the fan casing 15 from moving in the forward direction (upward direction) with respect to the heat sink 3. These mounting engaged sections 43 and 45 have a structure formed by notching the end edges of some adjacent radiation fins of the radiation fins 9 in the direction in which the radiation fins 9 are oriented.

Figure 9A:
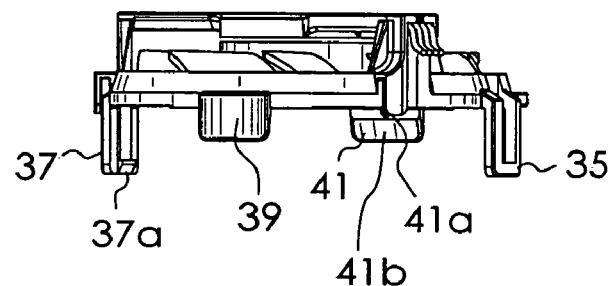
FIG. 9(A) is a front elevation view of the fan unit.
Figure 9B:
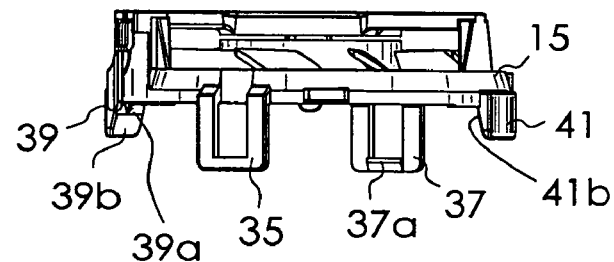
FIG. 9(B) is a right-side elevation view of the fan unit.
Figure 9C:
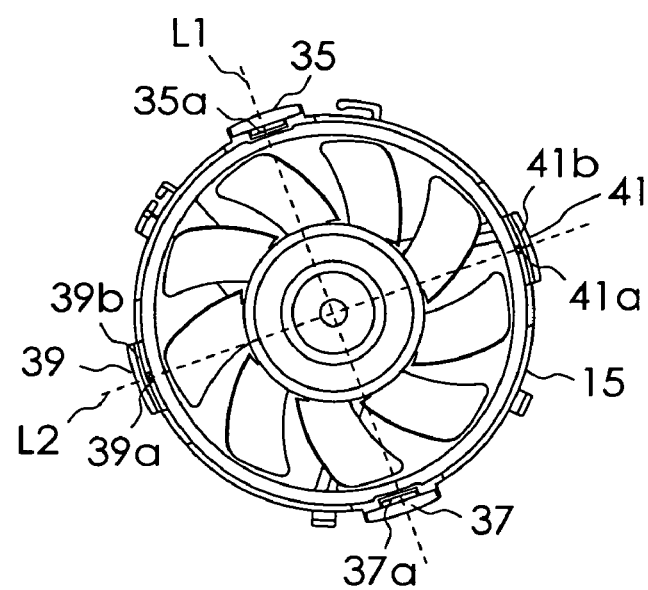
FIG. 9(C) is a bottom plan view of the fan unit.

As illustrated in FIGS. 9(A) to 9(C), the bases of the mounting engaging sections 39 and 41 of the second type are integrally fixed to the outer wall section 25 of the fan casing 15. The mounting engaging sections 39 and 41 of the second type have protrusions 39$a$ and 41$a$, respectively, on their inner surfaces adjacent to their bases. Each of these protrusions 39$a$ and 41$a$ is fit into an air flow passage formed between adjacent two radiation fins of the radiation fins 9, thereby preventing the fan casing 15 from rotating with respect to the axial of the revolving shaft 6$a$. Accordingly, the two radiation fins located on both sides of the air flow passage into which each of the protrusions 39$a$ and 41$a$ is inserted constitute mounting engaged sections for the mounting engaging sections 39 and 41 of the second type. By providing the mounting engaging sections 39 and 41 of the second type in addition to the mounting engaging sections 35 and 37 of the first type, it becomes possible for the fan unit 5 to be mounted to the radiation fins 9 of the heat sink 3 without rattling.

In this embodiment in particular, the pair of the mounting engaging sections 39 and 41 of the second type is disposed to be opposed to each other so that the heat sink 3 is sandwiched between them. Then, the inner surfaces of portions 39$b$ and 41$b$, located in the more backward direction (downward direction) than the protrusions 39$a$ and 41$a$ of the mounting engaging sections 39 and 41 of the second type, are so inclined as to be away further from said radiation fins as said inner surface becomes more backwardly located (downward in the drawings). With this arrangement, when the fan unit 5 is relatively moved toward the heat sink 3, each of the protrusions 39$a$ and 41$a$ can be moved toward the air flow passage formed between the two adjacent radiation fins with its inclined inner surface guided along the angular portions of some of the radiation fins 9 while being in contact with the some of the radiation fins 9. The protrusions 39$a$ and 41$a$ can thereby enter the air flow passages smoothly. Incidentally, the number of the protrusions 39$a$ and 41$a$ is not limited to one for one mounting engaging section, and two or more protrusions may be of course provided.

Further, in this embodiment, the pair of the mounting engaging sections 35 and 37 of the first type is disposed to oppose to each other so that the heat sink is sandwiched between them. Then, the pair of the mounting engaging sections 35 and 37 of the first type and the pair of the mounting engaging sections 39 and 41 of the second type are disposed so that a first virtual connecting line L1 that connects the pair of the mounting engaging sections 35 and 37 of the first type is orthogonal to a second virtual connecting line L2 that connects the mounting engaging sections 39 and 41. With this arrangement, the fan unit 5 can be mounted on the heat sink 3 using the least number of the mounting engaging sections 35, 37, 39 and 41 of the first and second types.

The heat sink used in the present invention is not limited to the one in this embodiment described above. The base, for example, may be extended in the axial direction, and all the radiation fins may be extended straightly from the base in the radial direction of the base. Alternatively, the heat sink having a structure in which the base extends in a direction perpendicular to the axial of the motor and a plurality of radiation fins are integrally provided on the surface of this base may be of course employed.

Further, the present invention is not limited to this embodiment, but various variations and modifications may be made without departing from the scope of the present invention.

What is claimed is:

1. A fan unit comprising:

a motor having a revolving shaft;

a motor supporting member located in a more forward direction than said revolving shaft, for supporting said motor, when one of two axial directions in which said revolving shaft extends is defined as the forward direction and the other of the two axial directions is defined as a backward direction;

an impeller having a plurality of blades and mounted on said revolving shaft, for rotation, said impeller being located in the more backward direction than said motor supporting member;

a fan casing with said impeller rotatably received therein; and a plurality of lead wires connected to said motor;

wherein a plurality of lead wire engaging sections are provided at an outer wall of said fan casing, said lead wire engaging sections being arranged at predetermined intervals along a contour of the outer wall when said fan casing is viewed from a predetermined position located in the forward direction;

said lead wire engaging sections are so configured to engage a part of said lead wires respectively and are used so as to prevent one or more of said lead wires from coming out of said fan casing during conveyance each of said lead wire engaging sections has:

a lead-wire-inserting opening through which a part of said lead wires is to be inserted; and a pair of lead-wire-extending openings formed to be continuous with the lead-wire-inserting opening in both directions intersecting a direction in which the part of said lead wires is to be inserted through the lead-wire-inserting opening, for allowing said lead wires to extend therethrough;

each of said lead wire engaging sections is configured to keep engaging the part of said lead wires when a force for pulling out the part of said lead wires through the lead-wire-inserting opening is not intentionally applied to said lead wires inserted through the lead-wire-inserting opening wherein said fan unit further comprises a plurality of webs arranged at predetermined intervals in the peripheral direction of said revolving shaft, for coupling said motor supporting member to said fan casing;

said lead wires are arranged along one of said webs;

said fan casing is located in the more backward direction than said motor supporting member;

said outer wall section of said fan casing includes an outer peripheral surface extending in both of the axial direction and the peripheral direction surrounding a periphery of said revolving shaft;

all of said lead wire engaging sections are provided on said outer peripheral surface of said outer wall section at the intervals in the peripheral direction;

said lead wire engaging sections include a first lead wire engaging section, located adjacent to said one of said webs, into which said lead wires are to be first inserted, a last lead wire engaging section, arranged next to said first lead wire engaging section, into which said lead wires are to be last inserted, and one or more intermediate lead wire engaging sections arranged between said first lead wire engaging section and said last lead wire engaging section;

the lead-wire-inserting opening of said first lead wire engaging section is open toward the backward direction, and the pair of lead-wire-extending openings are open toward both peripheral directions of said outer wall section; and wherein between the respective two adjacent lead wire engaging sections of said lead wire engaging sections including said first and last lead wire engaging sections and said one or more intermediate lead wire engaging section, one or more lead wire supporting section in contact with a part of said lead wires, for supporting the part of said lead wires is provided, so that said lead wires do not move in the backward direction.

2. The fan unit according to claim 1 wherein the lead-wire-inserting opening of said last lead wire engaging section is open toward a direction in which said first lead wire engaging section is located, and the pair of lead-wire-extending openings of said last lead wire engaging section are open toward both of the forward direction and the backward direction.

3. The fan unit according to claim 2, wherein the lead-wire-inserting opening of said one or more intermediate lead wire engaging sections is open toward the backward direction and the pair of lead-wire-extending openings of said one or more intermediate lead wire engaging sections are open toward both peripheral directions of said outer wall section.

4. The fan unit according to claim 3, wherein each of said first lead wire engaging section and said one or more intermediate lead wire engaging sections comprises:

a protruding portion extending from said outer peripheral surface in a radially outward direction of said revolving shaft; and a holding portion integrally provided at a distal end of the protruding portion and extending in the backward direction;

wherein the part of said lead wires is sandwiched between the holding portion and said outer peripheral surface; and the lead-wire-inserting opening is formed between a distal end of the holding portion and said outer peripheral surface, and the pair of the lead-wire-extending openings are constituted by two space portions formed by being surrounded by said outer peripheral surface, two end surfaces located at both sides of the protruding portion in the peripheral direction, and two end surfaces located at both sides of the holding portion in the peripheral direction.

5. The fan unit according to claim 2, wherein said first lead wire engaging section comprises:
   a protruding portion extending from said outer peripheral surface in a radially outward direction of said revolving shaft; and
   a holding portion integrally provided at a distal end of the protruding portion and extending in the peripheral direction;
   wherein the part of said lead wires is engaged into said last lead wire engaging section, being sandwiched between the holding portion and said outer peripheral surface; and
   the lead-wire-inserting opening is formed between a distal end of the holding portion and said outer peripheral surface, and the pair of the lead-wire-extending openings are constituted by two space portions formed by being surrounded by said outer peripheral surface, two end surfaces located at both sides of the protruding portion both in the forward and backward directions, and two end surfaces located at both sides of the holding portion in both of the forward and backward directions.

6. The fan unit according to claim 5, wherein a protrusion is integrally provided at a distal end of the holding portion, said protrusion protruding toward said outer peripheral surface and preventing the part of said lead wires located between the holding portion and said outer peripheral surface from coming out through the lead-wire-inserting opening.

7. The fan unit according to claim 1, wherein lead wire receiving grooves are formed in said one of said webs, said lead wire receiving grooves being open toward both directions in which said one of said webs extends and in the forward direction, for receiving said lead wires; and
   a lead wire coming-out prevention structure is integrally provided at ends of said one of said webs located in a radially outward direction of said revolving shaft, said lead wire coming-out prevention structure allowing said lead wires to be received within said lead wire receiving grooves, and preventing said lead wires from coming out said lead wire receiving grooves when said lead wires are bent in the backward direction.

8. A heat-emitting element cooling apparatus comprising:
   a heat sink having a base for absorbing heat from a heat emitting element and a plurality of radiation fins wholly or partially fixed to said base; and
   a fan unit disposed over said heat sink, for blowing air along said radiation fins to promote heat dissipation from said radiation fins; wherein
   said fan unit is an axial-flow fan unit comprising:
   a motor having a revolving shaft;
   a motor supporting member located in a more forward direction than said revolving shaft, for supporting said motor, when one of two axial directions in which said revolving shaft extends is defined as the forward direction and the other of the two axial directions is defined as a backward direction;
   an impeller having a plurality of blades and mounted on said revolving shaft, for rotation, said impeller being located in the more backward direction than said motor supporting member;
   a fan casing having a cylindrical venture with said impeller rotatably received therein;
   a plurality of lead wires connected to said motor;
   wherein a plurality of lead wire engaging sections are provided at an outer wall of said fan casing, said lead wire engaging sections being arranged at predetermined intervals along a contour of the outer wall when said fan casing is viewed from a predetermined position located in the forward direction; and
   said lead wire engaging sections are so configured to engage the part of said lead wires respectively, and are used so as to prevent one or more of said lead wires from coming out of said fan casing during conveyance
   each of said lead wire engaging sections has:
      a lead-wire-inserting opening through which a part of said lead wires is to be inserted; and
      a pair of lead-wire-extending openings formed to be continuous with the lead-wire-inserting opening in both directions intersecting a direction in which the part of said lead wires is to be inserted through the lead-wire-inserting opening, for allowing said lead wires to extend therethrough;
   each of said lead wire engaging sections is configured to keep engaging the part of said lead wires when a force for pulling out the part of said lead wires through the lead-wire-inserting opening is not intentionally applied to said lead wires inserted through the lead-wire-inserting opening
   wherein said fan unit further comprises a plurality of webs arranged at predetermined intervals in the peripheral direction of said revolving shaft, for coupling said motor supporting member to said fan casing;
   said lead wires are arranged alone one of said webs;
   said fan casing is located in the more backward direction than said motor supporting member;
   said outer wall section of said fan casing includes an outer peripheral surface extending in both of the axial direction and the peripheral direction surrounding a periphery of said revolving shaft;
   all of said lead wire engaging sections are provided on said outer peripheral surface of said outer wall section at the intervals in the peripheral direction;
   said lead wire engaging sections include a first lead wire engaging section, located adjacent to said one of said webs, into which said lead wires are to be first inserted, a last lead wire engaging section, arranged next to said first lead wire engaging section, into which said lead wires are to be last inserted, and one or more intermediate lead wire engaging sections arranged between said first lead wire engaging section and said last lead wire engaging section; the lead-wire-inserting opening of said first lead wire engaging section is open toward the backward direction, and the pair of lead-wire-extending openings are open toward both peripheral directions of said outer wall section; and
   wherein between the respective two adjacent lead wire engaging sections of said lead wire engaging sections including said first and last lead wire engaging sections and said one or more intermediate lead wire engaging section, one or more lead wire supporting section in contact with a part of said lead wires, for supporting the part of said lead wires is provided, so that said lead wires do not move in the backward direction.

\* \* \* \* \*